(12) United States Patent
Papotto et al.

(10) Patent No.: US 11,689,156 B1
(45) Date of Patent: Jun. 27, 2023

(54) VOLTAGE-CONTROLLED OSCILLATOR AND METHOD FOR USING THE SAME

(71) Applicant: STMicroelectronics S.r.l., Agrate Brianza (IT)

(72) Inventors: Giuseppe Papotto, Biancavilla (IT); Alessandro Parisi, Mascalucia (IT); Andrea Cavarra, Catania (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/643,068

(22) Filed: Dec. 7, 2021

(51) Int. Cl.
   *H03B 5/12* (2006.01)

(52) U.S. Cl.
   CPC ........... *H03B 5/124* (2013.01); *H03B 5/1215* (2013.01); *H03B 5/1265* (2013.01); *H03B 2200/004* (2013.01)

(58) Field of Classification Search
   CPC ..................................................... H03B 5/124
   USPC ...................................................... 331/117 R
   See application file for complete search history.

(56) References Cited

U.S. PATENT DOCUMENTS

| | | |
|---|---|---|
| 8,264,295 B2 | 9/2012 | Trivedi |
| 8,362,809 B2 | 1/2013 | Li et al. |
| 9,515,625 B2 | 12/2016 | Camilleri |
| 10,439,555 B2 | 10/2019 | Saric et al. |
| 10,804,844 B2 | 10/2020 | Brady et al. |
| 2008/0266007 A1 | 10/2008 | Tsai |
| 2012/0092081 A1* | 4/2012 | Upadhyaya ............ H03B 5/124 331/117 R |
| 2012/0235759 A1 | 9/2012 | Pfeiffer et al. |
| 2016/0065131 A1* | 3/2016 | Pavao-Moreira ......... H03L 7/18 331/108 C |

FOREIGN PATENT DOCUMENTS

| | | |
|---|---|---|
| CN | 101483434 A | 7/2009 |
| GB | 2327163 A | 1/1999 |

OTHER PUBLICATIONS

Basaligheh, Ali et al., "A Wide Tuning Range, Low Phase Noise, and Area Efficient Dual-Band Millimeter-Wave CMOS VCO Based on Switching Cores," IEEE Transactions on Circuits and Systems-I: Regular Papers, vol. 66, No. 8, Aug. 2019, pp. 2888-2897.

Chen, Zhiyuan et al., "Transformer-Based ultra-Wide Band 43 GHz VCO in 28 nm CMOS for FMCW Radar System," IEEE International Symposium on Circuits and Systems, May 2019, 5 pages.

(Continued)

*Primary Examiner* — Joseph Chang
(74) *Attorney, Agent, or Firm* — Slater Matsil, LLP

(57) ABSTRACT

A voltage controlled oscillator (VCO) includes: a pair of inductors coupled in series; a first pair of varactors coupled in series, and a second pair of varactors coupled in series. A first common mode node is between the respective varactors of the first pair of varactors and a second common mode node is between the respective varactors of the second pair of varactors. A supply voltage node is switchably coupled to the first common mode node through a first switch, the supply voltage node being a node located between the pair of inductors. A control voltage node ($V_C$) is switchably coupled to the second common mode node through a second switch.

20 Claims, 13 Drawing Sheets

(56) References Cited

OTHER PUBLICATIONS

Ferriss, Mark et al., "A 12-to-26GHz Fractional-N PLL With Dual Continuous Tuning LC-D/VCOs," IEEE International Solid-State Circuits Conference, Feb. 2, 2016, pp. 196-198, Yorktown Heights, NY.
Lin, Tsung-Hsien et al., "A 900-MHz 2.5-mA CMOS Frequency Synthesizer With an Automatic SC Tuning Loop," IEEE Journal of Solid-State Circuits, vol. 36, No. 3, Mar. 2001, pp. 424-431.
Lin, Tsung-Hsien et al., "An Agile VCO Frequency Calibration Technique for a 10-GHz CMOS PLL," IEEE Journal of Solid-State Circuits, vol. 42. No. 2, Feb. 2007, pp. 340-349.

* cited by examiner

VOLTAGE-CONTROLLED OSCILLATOR AND METHOD FOR USING THE SAME

TECHNICAL FIELD

The present disclosure relates generally to electronic circuits and, in particular embodiments, to voltage-controlled oscillators (VCOs).

BACKGROUND

Generally, Advanced Driver Assistance Systems (ADAS) are used in automotive applications to prevent accidents or reduce the severity of accidents resulting from collisions with stationary or moving objects. Advanced driver assistance system applications include adaptive cruise control, pre-crash safety systems, blind spot detection, lane change assistants, or the like. Advanced driver assistance systems may include short-range radar (SRR) and long-range radar (LRR) sensors arranged around cars to detect objects near the vehicle.

Radar systems sense the distance and speed of a target by measuring the time delay between a transmitted ($T_X$) signal emitted by the radar system and a corresponding, received ($R_X$) echo signal reflected by the target. Short-range radar sensors may operate in a short-range radar band (e.g., 77 GHz to 81 GHz) and cover a distance of up to a few centimeters with a high-power $R_X$ signal. Long-range radar sensors may operate in a long-range radar band (e.g., 76 GHz to 77 GHz) and cover a distance of up to hundreds of meters with a low-power $R_X$ signal. A transceiver radar that is able to cover both short-range radar and long-range radar bands is desirable to reduce costs and design efforts of the advanced driver assistance systems.

SUMMARY

In accordance with an embodiment, a voltage controlled oscillator (VCO) circuit includes: a pair of inductors coupled in series; a first pair of varactors coupled in series, a first common mode node being between the respective varactors of the first pair of varactors; a second pair of varactors coupled in series, a second common mode node being between the respective varactors of the second pair of varactors, a first terminal of the first pair of varactors being coupled to a first terminal of the second pair of varactors and a first terminal of the pair of inductors, and a second terminal of the first pair of varactors being coupled to a second terminal of the second pair of varactors and a second terminal of the pair of inductors; a supply voltage node switchably coupled to the first common mode node through a first switch, the supply voltage node being a node located between the pair of inductors; and a control voltage node ($V_C$) switchably coupled to the second common mode node through a second switch.

In accordance with another embodiment, a voltage controlled oscillator (VCO) circuit wo includes: a resonant circuit including a first pair of varactors and a second pair of varactors, a resonant frequency of the resonant circuit depending on a first capacitance of the first pair of varactors and a second capacitance of the second pair of varactors, the resonant frequency setting an output frequency of the VCO circuit; an oscillator core coupled to the resonant circuit; and a switching circuit configured to operate the VCO circuit in a first operating mode and a second operating mode, the switching circuit being configured to select the first pair of varactors for tuning the resonant frequency over a first frequency band in the first operating mode, and the switching circuit being configured to select the second pair of varactors for tuning the resonant frequency over a second frequency band outside the first frequency band in the second operating mode.

In accordance with yet another embodiment, a method of operating a voltage controlled oscillator (VCO) circuit includes: operating the VCO in a first operating mode using a switching circuit, the VCO circuit including a resonant circuit including a first pair of varactors, a second pair of varactors, and a resonant frequency setting an output frequency of the VCO, the switching circuit setting the first pair of varactors to tune the resonant frequency over a first frequency band in the first operating mode; and operating the VCO in a second operating mode using the switching circuit, the switching circuit setting the second pair of varactors to tune the resonant frequency over a second frequency band outside the first frequency band in the second operating mode.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present disclosure, and the advantages thereof, reference is now made to the following descriptions taken in conjunction with the accompanying drawings, in which.

Figure 1:
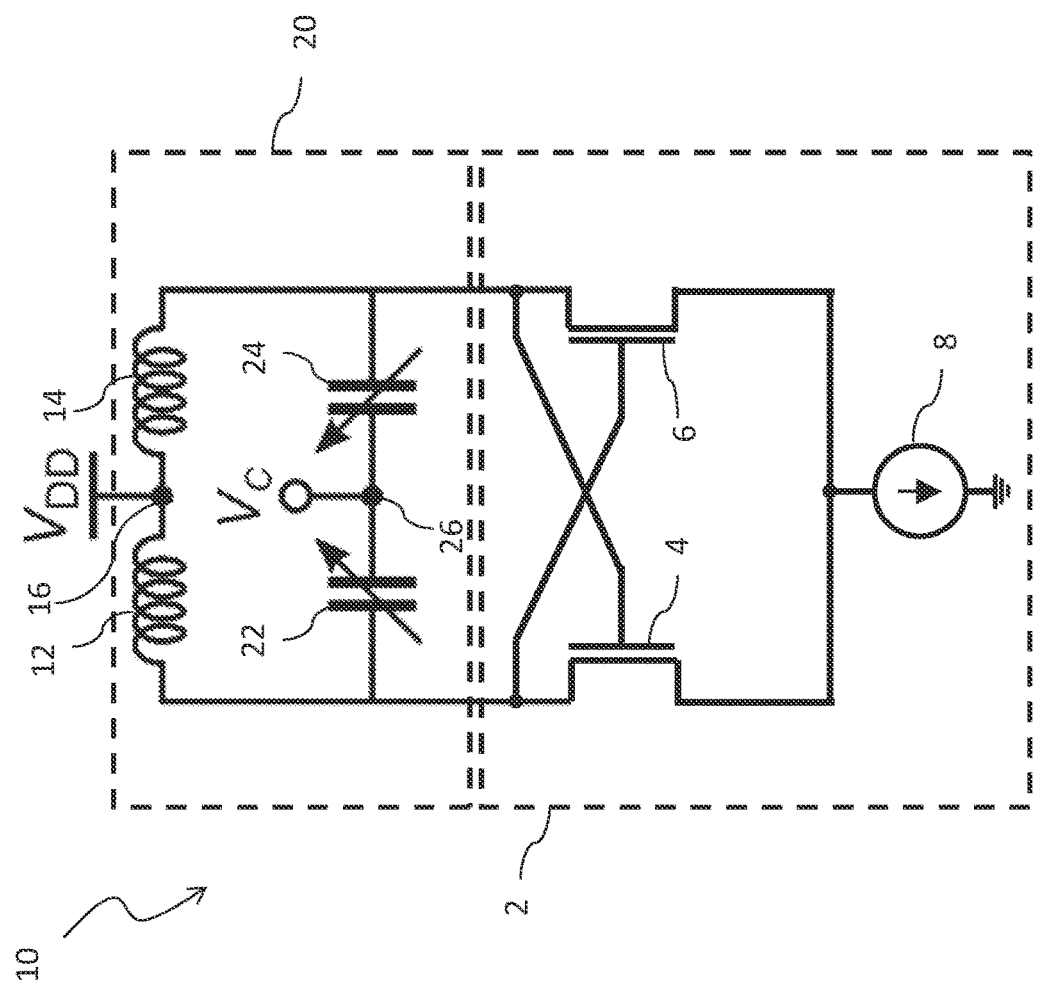
FIG. 1 is an example voltage-controlled oscillator.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

While inventive aspects are described primarily in the context of a voltage controlled oscillator operating within an advanced driver assistance system in an automotive application, the inventive aspects may be similarly applicable to other systems, other applications, and across different frequency ranges.

The references used herein are provided merely for convenience and hence do not define the extent of protection or the scope of the embodiments. It is desirable to be able to generate reference signals for a radar transmitter and receiver (e.g., an automotive radar system) that may cover both short-range radar and long-range radar bands to reduce costs and design efforts.

Embodiments of the disclosure provide solutions to problems outlined above by using a switching circuit including switches placed at the common mode nodes of varactors to enable dual-band VCO operation across, for example, short-range radar and long-range radar bands. Using a dual-band scheme allows a single VCO to cover a wider tuning range (e.g. 5 GHz) across both the short-range radar and long-range radar bands without increasing phase noise. Advantageously, because the switches are between connections of the common mode nodes with voltages and not along the signal path of the LC tank circuits, the configuration does not affect phase noise or parasitic capacitance of the LC tank circuit. By using single pairs of varactors to cover each frequency sub-band, the frequency to voltage gain of the VCO (the $k_{VCO}$) may be reduced by a factor in a range of 5/4 (e.g. for the short-range radar band) to 5 (e.g. for the long-range radar band), which may reduce phase noise. The Q-factor of the LC tank circuit may be increased and parasitic capacitances may be decreased by using the switching circuit with the switches connected to the common mode nodes of the varactors. This avoids the trade-off between LC tank Q-factor and tuning range that is required in other state of the art VCO designs. Additionally, the disclosed embodiments may be implemented compactly to reduce silicon area occupation, as the same LC tank circuit inductors and oscillator core are used for the short-range radar and long-range radar bands.

According to one or more embodiments of the present disclosure, voltage-controlled oscillator (VCO) circuits may comprise a switching circuit with switches placed at the common mode nodes of varactors in order to enable dual band operation. This allows a single VCO circuit to cover a wider range of frequencies (e.g. for short-range radar and long-range radar bands). The switches are disposed along connections of the common mode nodes with voltages and are not along the signal path of the LC tank circuits. This allows the configuration to enable switching between short-range radar and long-range radar modes without increasing either undesirable phase noise or parasitic capacitance. The Q-factor of the LC tank circuit may be increased and parasitic capacitances may be decreased with the disclosed switching circuit connection, reducing power consumption. Because the same LC tank circuit inductors and oscillator core are used for the short-range radar and long-range radar bands, the disclosed embodiments may be implemented compactly to decrease silicon area occupation.

Typically, radar systems use local oscillators such as voltage-controlled oscillators (VCOs) to generate reference signals for the radar transmitter and receiver. VCOs are oscillator circuits that produce an AC signal with a frequency dependent on a control voltage. A wide frequency tuning range (TR), such as about 5 GHz, is advantageous to cover the short-range radar and long-range radar bands (e.g. from 76 GHz to 81 GHz). However, radar sensitivity is limited by phase noise (PN), which may be more important for long-range radar applications due to the lower power of the $R_X$ signal. Achieving wide frequency TR and low PN simultaneously for VCOs is challenging due to, for example, high $k_{VCO}$ of large area varactors used by short-range radar applications.

FIG. 1 illustrates an example voltage-controlled oscillator (VCO) 10. The VCO 10 includes an LC tank circuit 20. The VCO 10 may also include an oscillator core 2. The oscillator core 2 includes cross-coupled transistor 4, cross-coupled transistor 6, and a current source 8. The current source 8 provides bias current for the cross-coupled transistor 4 and cross-coupled transistor 6 (e.g., CMOS or bipolar junction transistors). The VCO 10 is a differential circuit that provides a differential output voltage.

The LC tank circuit 20 includes inductor 12, inductor 14, varactor 22, and varactor 24 coupled in parallel. In some examples, each of the varactor 22 and varactor 24 may be a variable capacitor or the like.

A supply voltage $V_{DD}$ terminal is coupled to a supply voltage node 16 between inductor 12 and inductor 14. The varactor 22 and varactor 24 have a variable capacitance that may be adjusted by connecting a control voltage $V_C$ node to the common mode node 26 to tune the output frequency of the VCO 10 over a tuning range. Although the LC tank circuit 20 is illustrated as a single-supply voltage circuit with the oscillator core 2 being connected to a reference node, the LC tank circuit 20 may also be a dual-supply voltage circuit with the oscillator core 2 being connected to, for example, a negative supply voltage $-V_{DD}$ node instead of the reference node.

During the operation of the LC tank circuit 20, electric charge oscillates back and forth between inductor 12 and inductor 14 and between varactor 22 and varactor 24 with a resonant frequency $f_{VCO}$. The resonant frequency $f_{VCO}$ of the LC tank circuit 20 is given by Eq. (1):

$$f_{VCO} = 1/2\pi\sqrt{LC(V_C)} \qquad (1)$$

where L is the sum of the inductances of inductor 12 and inductor 14, and $C(V_C)$ is the total capacitance of the varactor 22 and varactor 24 in series as a function of the control voltage $V_C$. The LC tank circuit 20 has a parallel parasitic resistance $R_P$ representing resistive losses of the inductor 12, inductor 14, varactor 22, and varactor 24. To sustain oscillation, the cross-coupled transistor 4 and cross-coupled transistor 6 of the oscillator core 2 provide a negative resistance $-1/G_m$ that is larger than the parallel parasitic resistance $R_P$ of the LC tank circuit 20, as shown in Eq. (2):

$$R_P - \left(\frac{1}{G_m}\right) \le 0 \quad (2)$$

where $-G_m$ is the transconductance of the cross-coupled transistor 4 and cross-coupled transistor 6. As such, the oscillator core 2 drives the continued oscillation of the LC tank circuit 20 over the resistive losses from the parallel parasitic resistance $R_P$.

It is desirable to achieve a wide frequency tuning range (TR) of the VCO to cover the short-range radar and long-range radar bands, for example, from 76 GHz to 81 GHz, and reduce design and production costs. In some embodiments, the wide frequency tuning range (TR) of the VCO is over a range of smaller frequencies, e.g. 38 GHz to 40.5 GHz, that is subsequently increased to a range of 76 GHz to 81 GHz by a frequency doubler. However, large area varactors with sufficient variable capacitance to achieve the wide frequency TR lead to high $k_{VCO}$, resulting to increased undesirable phase noise.

In various embodiments described in this application, multiple overlapped tuning sub-bands may be employed to achieve the desired wide frequency TR, with each sub-band covered by a single pair of varactors. Using this approach, the frequency to voltage gain of the VCO (the $k_{VCO}$) may be reduced by a factor in a range of 5/4 (e.g. for the short-range radar band) to 5 (for the long-range radar band), which may reduce phase noise.

Figure 2:
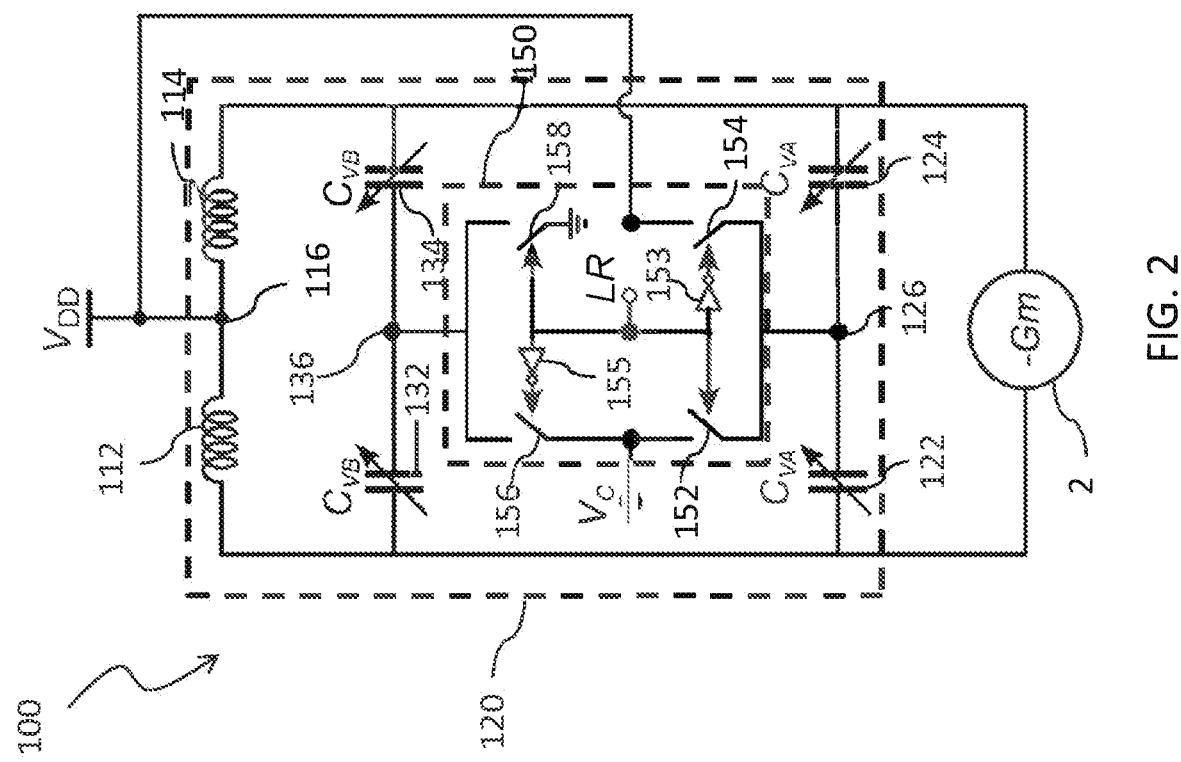
FIG. 2 is a schematic of an embodiment voltage-controlled oscillator.

FIG. 2 illustrates a dual-band VCO 100, in accordance with some embodiments.

The dual-band VCO boo may include a dual-band LC tank circuit 120 and a switching circuit 150. The dual-band VCO 100 may also include an oscillator core 2. In an embodiment, the dual-band LC tank circuit 120 is a single resonant circuit that operates in a first operating mode to produce a resonant frequency tunable across the long-range radar frequency band and a second operating mode to produce a resonant frequency tunable across the short-range radar frequency band.

The dual-band LC tank circuit 120 includes a first inductor 112, a second inductor 114, a pair of first varactors $C_{VA}$, and a pair of second varactors $C_{VB}$ In some embodiments, the dual-band LC tank circuit 120 is a single-ended circuit with the oscillator core 2 being connected to a reference node. In various embodiments, the varactors may be replaced with a variable capacitor or the like. In embodiments, the minimum varactor size is adopted for each frequency sub-band.

In some embodiments, the dual-band LC tank circuit 120 is a dual-supply voltage circuit with the oscillator core 2 connected to, for example, a negative supply voltage $-V_{DD}$ node instead of the reference node illustrated in FIG. 2. First inductor 112 and second inductor 114 are coupled in series with oscillator core 2.

The oscillator core 2 provides a negative resistance $-1/G_m$. larger than the parallel parasitic resistance $R_P$ of the dual-band LC tank circuit 120. The oscillator core 2 is included as a non-limiting example. Any suitable oscillator core may be used and is within the scope of the disclosed embodiments.

Each of the pair of first varactor 122 and first varactor 124, the pair of second varactor 132 and second varactor 134, and the pair of inductor 112 and inductor 114, is coupled to oscillator core 2 in parallel. Accordingly, a first terminal of the pair of first varactor 122 and first varactor 124 is coupled to a first terminal of the pair of second varactor 132 and second varactor 134 and a second terminal of the pair of first varactor 122 and first varactor 124 is coupled to a second terminal of the pair of second varactor 132 and second varactor 134.

A first common mode node 126 is between the first varactor 122 and first varactor 124. A second common mode node 136 is between the second varactor 132 and the second varactor 134.

The switching circuit 150 includes first switch 152, second switch 154, third switch 156, and fourth switch 158. The various switches of the switching circuit 150 allow the dual-band VCO 100 to operate in a long-range radar band mode (see below, FIG. 3) or a short-range radar band mode (see below, FIG. 4).

Because the same inductors (e.g., first inductor 112 and second inductor 114) and oscillator core 2 from the same single circuit are used for both the first operating mode in the long-range radar frequency band and the second operating mode in the short-range radar frequency band, the dual-band VCO 100 may be implemented compactly to reduce silicon area footprint.

The first inductor 112 and second inductor 114 are coupled in series with the oscillator core 2. Supply voltage node 116 is arranged between inductor 112 and inductor 114. The inductor 112 and inductor 114 may be planar inductors having interconnect material (e.g., aluminum, copper, or the like) laid out in a spiral coil pattern, gyrators, or the like. However, any suitable inductors may be used. In some embodiments, a single inductor or more than two inductors are used. A supply voltage $V_{DD}$ terminal is coupled to the supply voltage node 116.

The pair of first varactor 122 and first varactor 124 may be used to control the resonant frequency $f_{VCO}$ of the dual-band LC tank circuit 120 when operating in a first operating mode (e.g., in the long-range radar frequency band).

A control voltage $V_C$ node connected to, e.g., a phase locked loop (PLL), may be connected to the first common mode node 126 to control the variable capacitance of the first varactor 122 and first varactor 124. The capacitances of the first varactor 122 and first varactor 124 may be chosen to be as small as possible while still covering the long-range radar frequency band to reduce LC tank losses and improve phase noise performance.

In some embodiments, such as for an operating frequency of around 40 GHz with an inductor value of wo pH, the first varactor 122 and first varactor 124 have variable capacitances in a range of 30 fF to 40 fF over an input voltage range of 0 V to 1 V.

The pair of second varactor 132 and second varactor 134 may be used to control the resonant frequency $f_{VCO}$ of the dual-band LC tank circuit 120 when operating in a second operating mode (e.g., in the short-range radar frequency band).

A control voltage $V_C$ node connected to, e.g., a phase locked loop (PLL), may be connected to the second common mode node 136 to control the variable capacitance of the second varactor 132 and second varactor 134. The capacitances of the second varactor 132 and second varactor 134 may be chosen to be as small as possible while still covering the short-range radar frequency band to reduce LC tank losses and improve phase noise performance.

In some embodiments, such as for an operating frequency of around 40 GHz with an inductor value of wo pH, the second varactor 132 and second varactor 134 have variable capacitances in a range of 120 fF to 160 fF over an input voltage range of 0 V to 1V.

In an embodiment, the first varactor 122, first varactor 124, second varactor 132, and second varactor 134 are accumulation-mode MOS (AMOS) varactors. However, it is noted that any suitable type of voltage-controlled capacitor may be used.

The switching circuit 150 allows the dual-band VCO 100 to switch between a first operating mode in which the dual-band LC tank circuit 120 has a resonant frequency, for example, in the long-range radar band (e.g., in the range of 38 GHz to 38.5 GHz that is subsequently increased to 76 GHz to 77 GHz by a frequency doubler driven by the dual-band VCO 100) and a second operating mode in which the dual-band LC tank circuit 120 has a resonant frequency, for example, in the short-range radar band (e.g., in the range of 38.5 GHz to 40.5 GHz that is subsequently increased to 77 GHz to 81 GHz by a frequency doubler driven by the dual-band VCO 100).

First switch 152 is coupled between the first common mode node 126 and a control voltage $V_C$ node. Second switch 154 is coupled between the first common mode node 126 and the supply voltage $V_{DD}$ terminal. Third switch 156 is coupled between the second common mode node 136 and the control voltage $V_C$ node. Fourth switch 158 is coupled between the second common mode node 136 and a reference node.

First switch 152, second switch 154, third switch 156, and fourth switch 158 may be any type of switch suitable for a circuit. In some embodiments, first switch 152, second switch 154, third switch 156, and fourth switch 158 are transistors that are on when the switches are closed and off when the switches are open. When a digital signal is applied as a bias voltage, the switches are opened or closed.

In various embodiments, control terminals of the first switch 152, second switch 154, third switch 156, and fourth switch 158 are coupled to control terminals of a digital signal LR, which is configured to open and close the switches. The digital signal LR may be, e.g., a static control bit for an automotive radar application. In certain embodiments, the digital signal LR may be coupled without inversion to first switch 152 and fourth switch 158 so that they are closed when the digital signal LR is '0' (i.e., low) and open when the digital signal LR is '1' (i.e., high).

In certain embodiments, the digital signal LR may be coupled through a first inverter 153 to second switch 154 and through a second inverter 155 to third switch 156 so that they are open when the digital signal LR is '0' (i.e., low) and closed when the digital signal LR is '1' (i.e., high).

The placement of the first inverter 153 with respect to the second switch 154 and the second inverter 155 with respect to the third switch 156 is included as a non-limiting example. In embodiments, the digital signal LR is connected through respective inverters to the first switch 152 and fourth switch 158 so that they are open when the digital signal LR is '0' (i.e., low) and closed when the digital signal LR is '1' (i.e., high). In embodiments, the digital signal LR may be coupled without inversion to the second switch 154 and the third switch 156 so that they are closed when the digital signal LR is '0' (i.e., low) and open when the digital signal LR is '1' (i.e., high). Thus, any such suitable arrangement of the digital signal LR, inverters, and switches is included within the scope of the disclosed embodiments.

Because first switch 152, second switch 154, third switch 156, and fourth switch 158 are arranged between connections of the first common mode node 126 and second common mode node 136 with voltages or the reference node, the switches are not along the signal path of the dual-band LC tank circuit 120. Thus, the differential oscillating signal of the dual-band LC tank circuit 120 does not pass through first switch 152, second switch 154, third switch 156, and fourth switch 158. Therefore, first switch 152, second switch 154, third switch 156, or fourth switch 158 do not affect phase noise or parasitic capacitance of the dual-band LC tank circuit 120.

Figure 3:
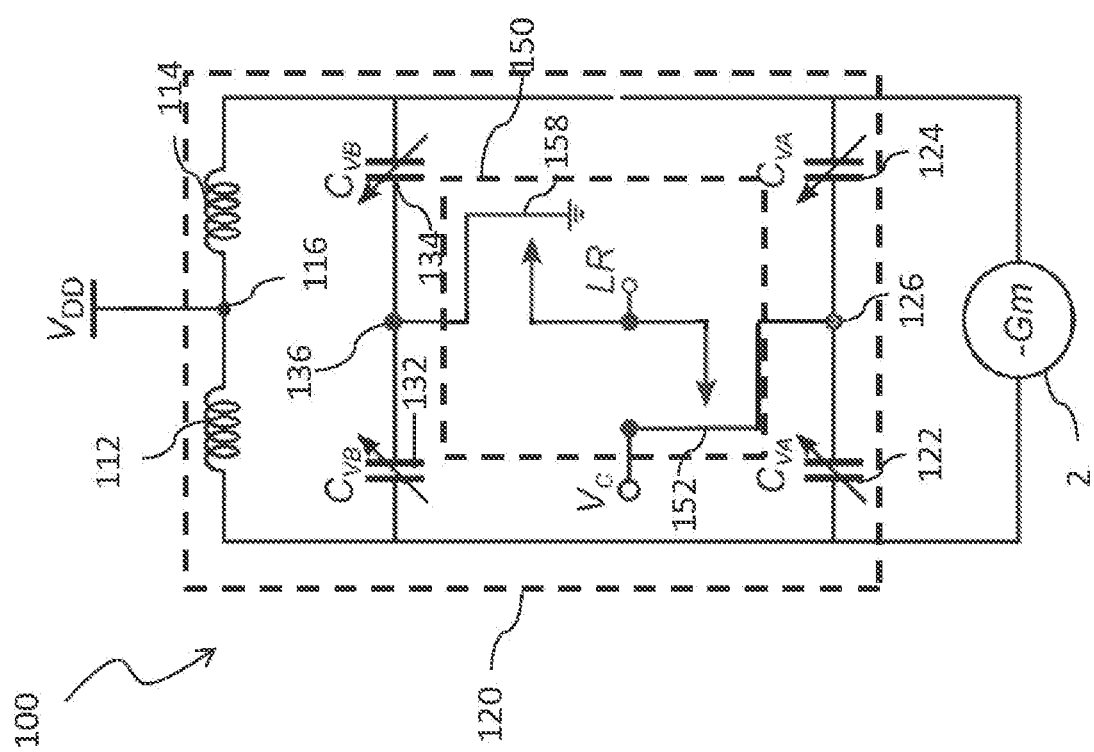
FIG. 3 is a schematic of an embodiment voltage-controlled oscillator.

FIG. 3 illustrates the dual-band VCO 100 in the first operating mode, according to an embodiment. In the first operating mode, the first varactor 122 and first varactor 124 control the resonant frequency $f_{VCO}$ of the dual-band LC tank circuit 120. As such, the dual-band VCO is tunable within, for example, the long-range radar frequency band (e.g., across 0.5 GHz: from 38 GHz to 38.5 GHz prior to being increased by a frequency doubler) using the pair of first varactors $C_{VA}$.

The digital signal LR is set to '1' (i.e., high) in the first operating mode, which closes first switch 152 and fourth switch 158. The signal to second switch 154 and third switch 156 is inverted, respectively, through first inverter 153 and second inverter 155. Thus, the high signal from digital signal LR is converted to a low signal through the inverters, opening second switch 154 and third switch 156. As a result, the voltage at the first common mode node 126 is set to the control voltage $V_C$, and the voltage at the second common mode node 136 is set to the voltage of the reference node (e.g., reference ground).

The closing of fourth switch 158 biases the second varactor 132 and second varactor 134 to their maximum capacitance. In some embodiments in which the second varactor 132 and second varactor 134 are AMOS varactors, closing fourth switch 158 couples the second common mode node 136 to the reference node, which sets the second varactor 132 and second varactor 134 to maximum capacitance by biasing them between the reference node and the supply voltage $V_{DD}$ terminal coupled to supply voltage node 116.

Setting second varactor 132 and second varactor 134 to the maximum capacitance allows the pair of second varactors $C_{VB}$ to function as fixed capacitors and provide a fixed contribution to the overall capacitance of the dual-band LC tank circuit 120.

The closing of first switch 152 sets the voltage at the first common mode node 126 to the control voltage $V_C$, which enables the capacitance of each of the first varactor 122 and first varactor 124 to be tuned by adjusting the control voltage $V_C$. The overall capacitance of the dual-band VCO 100 is, thus, the contribution of the tuned capacitance from the first varactor 122 and first varactor 124 and the fixed contribution from the second varactor 132 and second varactor 134 set to the maximum capacitance.

Thus, in the first operating mode, the resonant frequency $f_{VCO}$ can be tuned within the, for example, long-range radar frequency band (e.g., 38 GHz to 38.5 GHz that is subsequently increased to 76 GHz to 77 GHz by a frequency doubler driven by the dual-band VCO 100) by adjusting the control voltage $V_C$, as illustrated below in FIG. 8. Using first varactor 122 and first varactor 124 to cover, for example, the long-range radar frequency band, the frequency to voltage gain of the VCO (the $k_{VCO}$) may be reduced by a factor of about 5 (for the long-range radar band), which may reduce phase noise.

Figure 4:
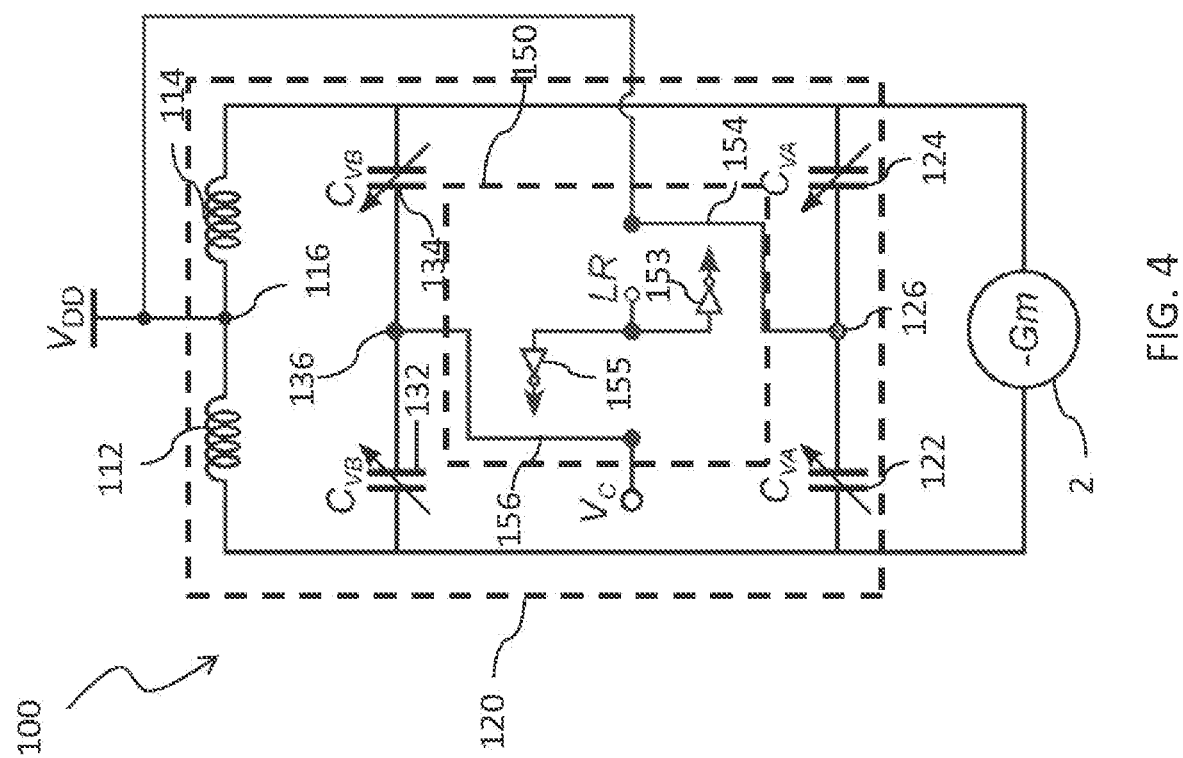
FIG. 4 is a schematic of an embodiment voltage-controlled oscillator.

FIG. 4 illustrates the dual-band VCO 100 in the second operating mode, according to an embodiment. In the second operating mode, second varactor 132 and second varactor 134 are used to control the resonant frequency $f_{VCO}$ of the dual-band LC tank circuit 120 to be tunable within, for example, the short-range radar frequency band (e.g., across 2 GHz: from 38.5 GHz to 40.5 GHz that is subsequently increased to 77 GHz to 81 GHz by a frequency doubler driven by the dual-band VCO 100) using the pair of second varactors $C_{VB}$.

The digital signal LR is set to '0' (i.e., low) in the second operating mode, which opens first switch 152 and fourth switch 158. The signal to second switch 154 and third switch 156 is inverted, respectively, through first inverter 153 and second inverter 155. Thus, the low signal from digital signal LR is converted to a high signal through the inverters, closing second switch 154 and third switch 156. As a result, the voltage at the second common mode node 136 is set to the control voltage $V_C$, and the voltage at the first common mode node 126 is set to the supply voltage $V_{DD}$.

The closing of second switch 154 biases the first varactor 122 and first varactor 124 to their minimum capacitance. In some embodiments in which the first varactor 122 and first varactor 124 are AMOS varactors, closing second switch 154 couples the first common mode node 126 to the supply voltage $V_{DD}$ terminal, which sets first varactor 122 and first varactor 124 to minimum capacitance.

Setting first varactor 122 and first varactor 124 to the minimum capacitance allows the pair of first varactors $C_{VA}$ to function as fixed capacitors and provide a fixed contribution to the overall capacitance of the dual-band LC tank circuit 120.

The closing of third switch 156 sets the voltage at the second common mode node 136 to the control voltage $V_C$, which enables the capacitance of each of the second varactor 132 and second varactor 134 to be tuned by adjusting the control voltage $V_C$. The overall capacitance of the dual-band VCO 100 is, thus, the contribution of the tuned capacitance from the second varactor 132 and second varactor 134 and the fixed contribution from the first varactor 122 and first varactor 124 set to the minimum capacitance.

Thus, in the second operating mode, the resonant frequency $f_{VCO}$ can be tuned within the, for example, short-range radar frequency band (e.g., 38.5 GHz to 40.5 GHz that is subsequently increased to 77 GHz to 81 GHz by a frequency doubler) by adjusting the control voltage $V_C$, as illustrated below in FIG. 8. Using second varactor 132 and second varactor 134 to cover, for example, the short-range radar frequency band, the $k_{VCO}$ of the dual-band LC tank circuit 120 is set to improve phase noise performance.

Although embodiments in FIGS. 2-4 have been described using a dual-band VCO, this architecture can be easily extended to multi-band VCOs. For example, a three-band VCO will include another pair of varactors and switches with appropriate logic circuitry to ensure the operation of the multi-band VCO in a third operating state.

Figure 5:
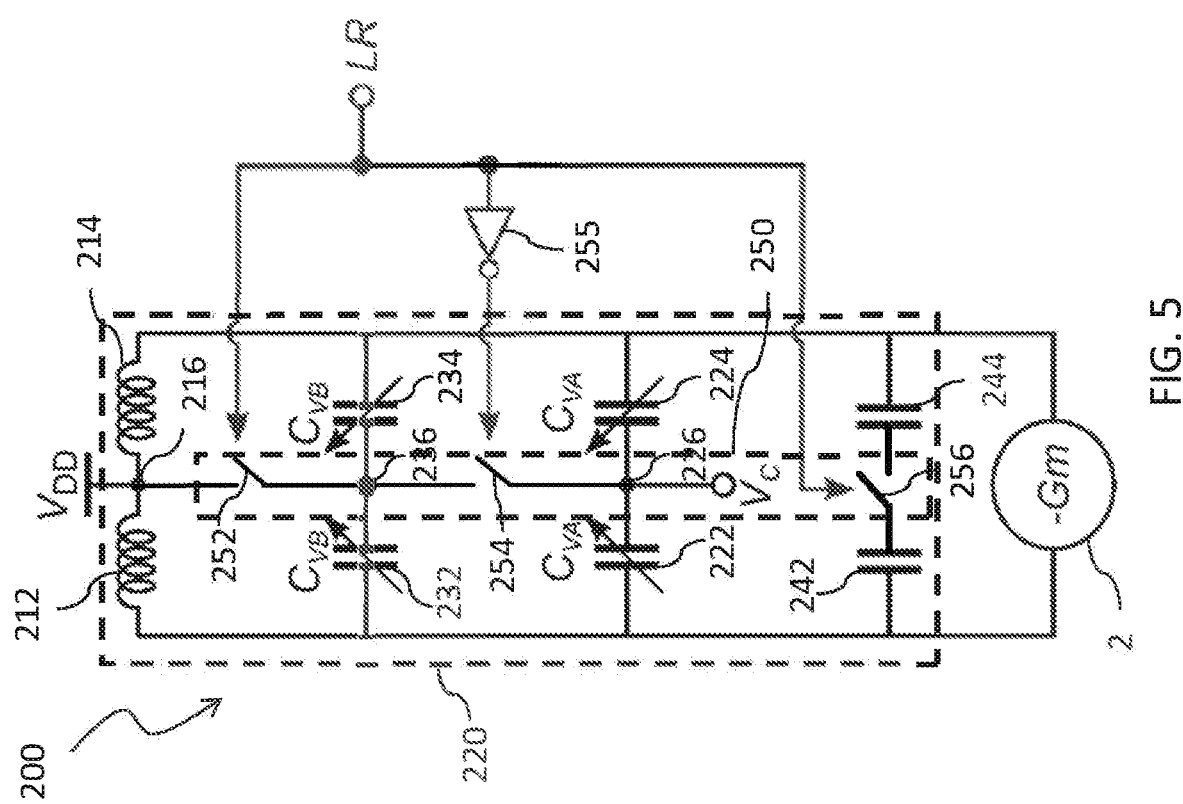
FIG. 5 is a schematic of an embodiment voltage-controlled oscillator.

FIG. 5 illustrates a dual-band VCO 200, in accordance with some embodiments. The dual-band VCO 200 includes a dual-band LC tank circuit 220 and a switching circuit 250. The dual-band VCO 200 may include an oscillator core 2.

The dual-band LC tank circuit 220 is a single resonant circuit that operates in a first operating mode and a second operating mode. In the first operating mode, the dual-band VCO 200 operates across a resonant frequency over, for example, the long-range radar frequency band. In the second operating mode, the dual-band VCO 200 operates across a resonant frequency over, for example, the short-range radar frequency band.

The dual-band LC tank circuit 220 includes first inductor 212 and second inductor 214, a pair of first varactors $C_{VA}$ (first varactor 222 and first varactor 224), a pair of second varactors $C_{VB}$ (second varactor 232 and second varactor 234), first capacitor 242, and second capacitor 244.

First inductor 212 and second inductor 214 may be similar to, respectively, the first inductor 112 and second inductor 114 as described above with respect to FIGS. 2, 3, and 4. However, any suitable inductor may be used. In some embodiments, a single inductor or more than two inductors are used.

The first varactor 222 and first varactor 224 may be similar to, respectively, the first varactor 122 and first varactor 124 as described above with respect to FIG. 2. The second varactor 232 and second varactor 234 may be similar to, respectively, the second varactor 132 and second varactor 134 as described above with respect to FIG. 2. However, any suitable type of voltage-controlled capacitor may be used in place of the various varactors shown.

The first capacitor 242 and second capacitor 244 may be any suitable type of capacitor. In some embodiments, such as for an operating frequency of around 40 GHz with an inductor value of wo pH, the first and second capacitors 242 and 244 have capacitances in a range of 0 fF to 50 fF.

First switch 252 is arranged between the second common mode node 236 and supply voltage node 216. Second switch 254 is arranged between the first common mode node 226 and the second common mode node 236. Third switch 256 is arranged between first capacitor 242 and second capacitor 244.

Control terminals of first switch 252, second switch 254, and third switch 256 are connected to a control terminal of digital signal LR. By setting the digital value of the digital signal LR, the various switches are configured to operate in one of open or closed positions.

First switch 252, second switch 254, and third switch 256 may be any type of switch suitable for a circuit. In some embodiments, first switch 252, second switch 254, and third switch 256 are transistors that are on when the switches are closed and off when the switches are open. When a digital voltage is applied as a bias voltage, the switches are opened or closed.

In embodiments, the digital signal LR may be connected without inversion to first switch 252 and third switch 256 so that they are closed when the digital signal LR is '0' (i.e., low) and open when the digital signal LR is '1' (i.e., high). The digital signal LR may be connected through an inverter 255 to second switch 254 so that it is open when the digital signal LR is '0' and closed when the digital signal LR is '1'.

Similar to the embodiment in FIG. 2, the arrangement of the inverters and switches are non-limiting. In embodiments, the digital signal LR is connected through respective inverters to the first switch 252 and third switch 256 so that they are open when the digital signal LR is '0' (i.e., low) and closed when the digital signal LR is '1' (i.e., high). In embodiments, the digital signal LR is connected without inversion to the second switch 254 so that it is closed when the digital signal LR is '0' (i.e., low) and open when the digital signal LR is '1' (i.e., high).

The oscillator core 2 provides a negative resistance $-1/G_m$ larger than the parallel parasitic resistance $R_P$ of the dual-band LC tank circuit 220. First inductor 212 and second inductor 214 are coupled in series with oscillator core 2.

In various arrangements, combinations of the pair of first varactors $C_{VA}$, pair of second varactors $C_{VB}$, first capacitor 242 and second capacitor 244, and first inductor 212 and second inductor 214, are coupled in parallel with the oscillator core 2.

A first common mode node 226 is between first varactor 222 and first varactor 224. A second common mode node 236 is between second varactor 232 and second varactor 234.

The switching circuit 250 includes first switch 252, second switch 254, and third switch 256. The switching circuit enables the dual-band VCO 100 to operate in a first operating mode (see below, FIG. 6) or a second operating mode (see below, FIG. 7).

Because the same inductors (e.g., first and second inductors 212 and 214) and oscillator core 2, from the same single circuit, are used for both the first operating mode (i.e., across the long-range radar frequency band) and the second operating mode (i.e., across the short-range radar frequency band), the dual-band VCO 200 may be implemented compactly to reduce silicon area occupation.

First inductor 212 and second inductor 214 are coupled with the oscillator core 2. As shown, supply voltage node 216 is between first inductor 212 and second inductor 214. The supply voltage $V_{DD}$ terminal is coupled to supply voltage node 216.

Switching circuit 250 allows the dual-band VCO 200 to switch between the first operating mode and the second operating mode.

As shown, first switch 252 and second switch 254 are between connections of, respectively, the first common mode node 226 and second common mode node 236. As such, the differential oscillating signal of the dual-band LC tank circuit 220 is isolated, and the switch 252 and second switch 254 do not increase phase noise or parasitic capacitance of the dual-band LC tank circuit 220.

Figure 6:
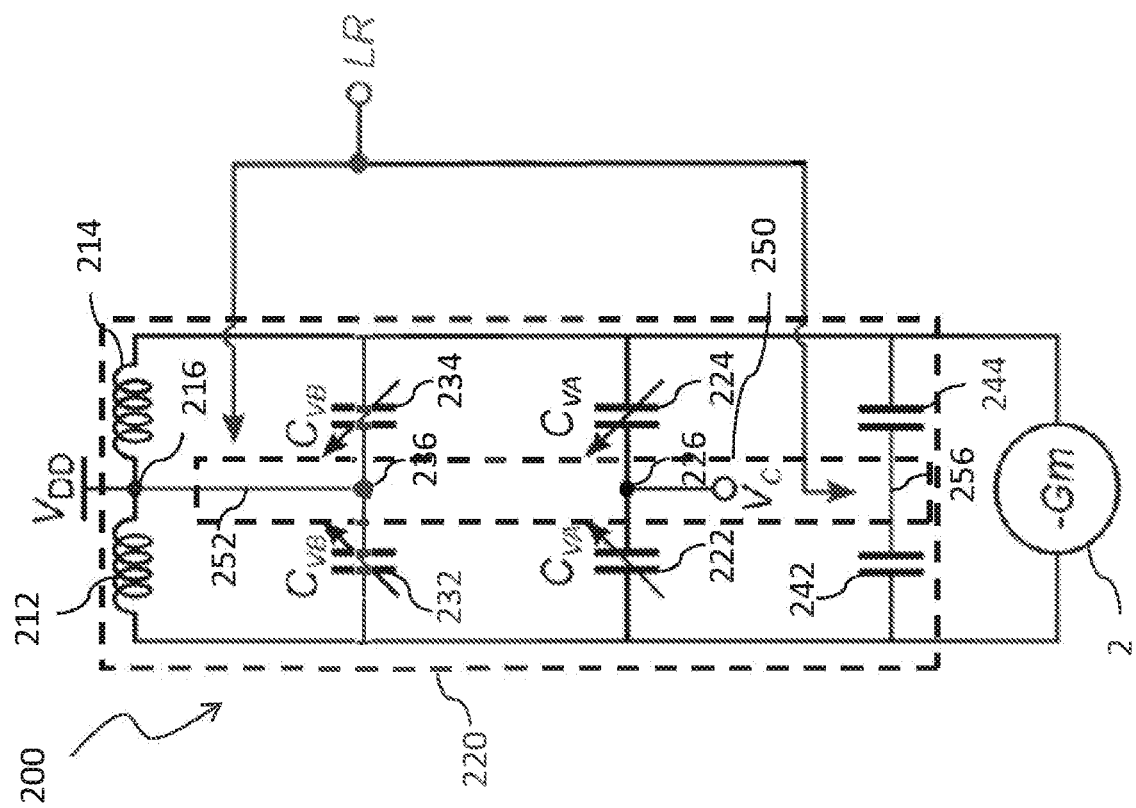
FIG. 6 is a schematic of an embodiment voltage-controlled oscillator.

FIG. 6 illustrates the embodiment dual-band VCO 200 in the first operating mode. In the first operating mode, digital signal LR is set to '1'. In the first operating mode, first switch 252 and third switch 256 are in the closed position, and second switch 254 is in the open position. The voltage at the first common mode node 226 is set to the control voltage $V_C$. The voltage at the second common node is set to the supply voltage $V_{DD}$. As third switch 256 is in the closed position, the capacitance of first capacitor 242 and second capacitor 244 contributes to the overall capacitance of the dual-band LC tank circuit 220.

The pair of second varactors $C_{VB}$ are fixed, and by adjusting the capacitance of the pair of first varactors $C_{VA}$ through the adjustment of the control voltage $V_C$, the resonant frequency $f_{VCO}$ of the dual-band LC tank circuit 220 is tuned across the, for example, long-range radar frequency band.

Figure 7:
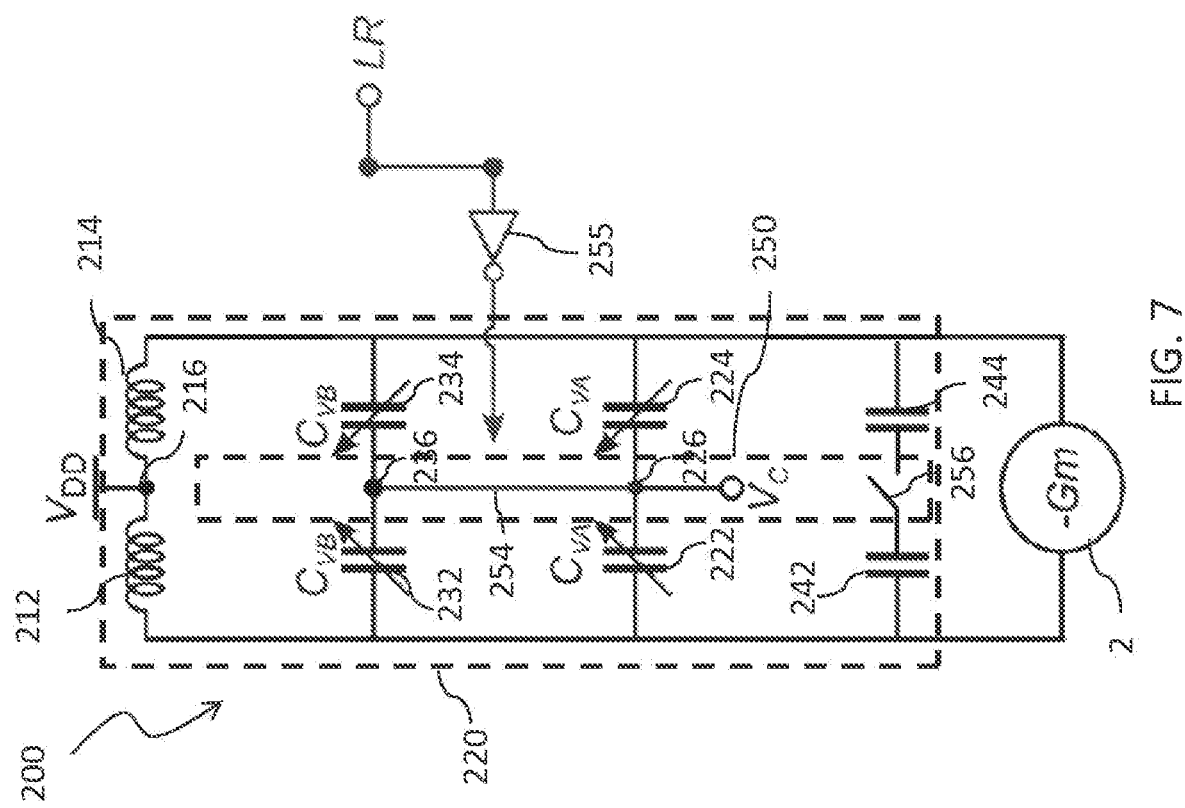
FIG. 7 is a schematic of an embodiment voltage-controlled oscillator.

FIG. 7 illustrates the embodiment dual-band VCO 200 in the second operating mode. In the second operating mode, digital signal LR is set to '0'. In the second operating mode, first switch 252 and third switch 256 are in the open position, and second switch 254 is in the closed position. The voltage at first common mode node 226 and the voltage at second common mode node 236 are set to the control voltage $V_C$. As third switch 256 is in the open position, the capacitances of first capacitor 242 and second capacitor 244 are excluded from the dual-band LC tank circuit 220.

By adjusting the capacitances of the pair of second varactors $C_{VB}$ and pair of first varactors $C_{VA}$ through the adjustment of the control voltage $V_C$, the resonant frequency $f_{VCO}$ of the dual-band LC tank circuit 220 is tuned across the, for example, the short-range radar frequency band.

In some embodiments, the dual-band VCO boo or dual-band VCO 200 are implemented on one or more semiconductor chips. The semiconductor chips may be, for example, fully depleted silicon-on-insulator (FD-SOI) complementary metal-oxide-semiconductor (CMOS) chips. The dual-band VCO 100 or dual-band VCO 200 may be integrated as 38 GHz VCOs connected to frequency doublers, e.g. respective 77 GHz power amplifiers (PAs). However, the dual-band VCO 100 or dual-band VCO 200 may be implemented using any suitable circuit components and integrated on any suitable chip, die, or device.

Although embodiments of FIGS. 5-7 have been described using a dual-band VCO, this architecture can be easily extended to multi-band VCOs. For example, a three-band VCO will include another pair of varactors and switches to ensure the operation of the multi-band VCO in a third operating state.

Figure 8:
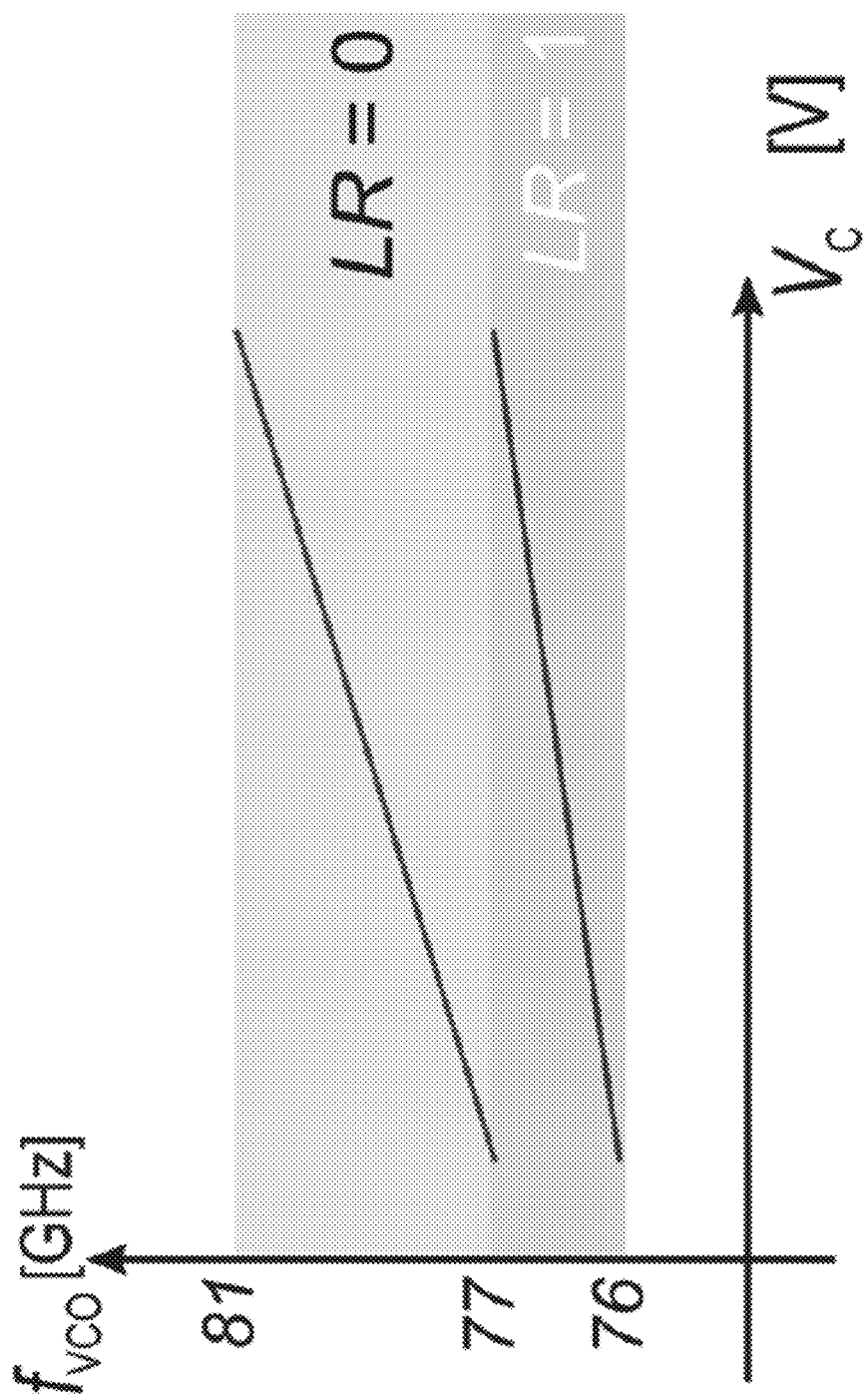
FIG. 8 is a chart of an embodiment showing a frequency of a dual-band voltage-controlled oscillator as a function of a control voltage.

FIG. 8 illustrates an embodiment relationship of resonant frequency $f_{VCO}$ of a dual-band VCO (such as the dual-band VCO 100 described above with respect to FIGS. 2-4 or the dual-band VCO 200 described above with respect to FIGS. 5-7) as a function of the control voltage $V_C$.

In the first operating mode, the digital signal LR is set to '1' (i.e., high). This causes the switching circuit of the dual-band VCO 100 or 200 to set the pair of second varactors $C_{VB}$ to a fixed capacitance while the pair of first varactors $C_{VA}$ are tuned to the control voltage $V_C$. By adjusting the value of the control voltage $V_C$, the resonant frequency $f_{VCO}$ is tuned across, for example, the long-range radar frequency band of 38 GHz to 38.5 GHz that is subsequently increased to 76 GHz to 77 GHz by a frequency doubler.

In the second operating mode, the digital signal LR is set to '0' (i.e., low). In the case of the dual-band VCO 100, this causes the switching circuit of the dual-band VCO 100 to set the pair of first varactors $C_{VA}$ to a fixed capacitance while the pair of second varactors $C_{VB}$ are connected to the control voltage $V_C$. In the case of the dual-band VCO 200, this causes the switching circuit of the dual-band VCO 200 to connect both the pair of first varactors $C_{VA}$ and the pair of second varactors $C_{VB}$ to the control voltage $V_C$. Thus, in the second operating mode, pair of first varactors $C_{VA}$ and the pair of second varactors $C_{VB}$ are used to tune the resonant frequency $f_{VCO}$. By adjusting the value of the control voltage VC, the resonant frequency $f_{VCO}$ is tuned across, for example, the short-range radar frequency band of 38.5 GHz to 40.5 GHz that is subsequently increased to 77 GHz to 81 GHz by a frequency doubler.

By tuning the resonant frequency $f_{VCO}$ in the first operating mode and the second operating mode, the output frequency of the dual-band VCO 100 or 200 may be set within the tuning range of 38.5 GHz to 40.5 GHz and be subsequently increased to 77 GHz to 81 GHz by a frequency doubler (i.e., across both the long-range radar and short-range radar frequency bands).

Figure 9:
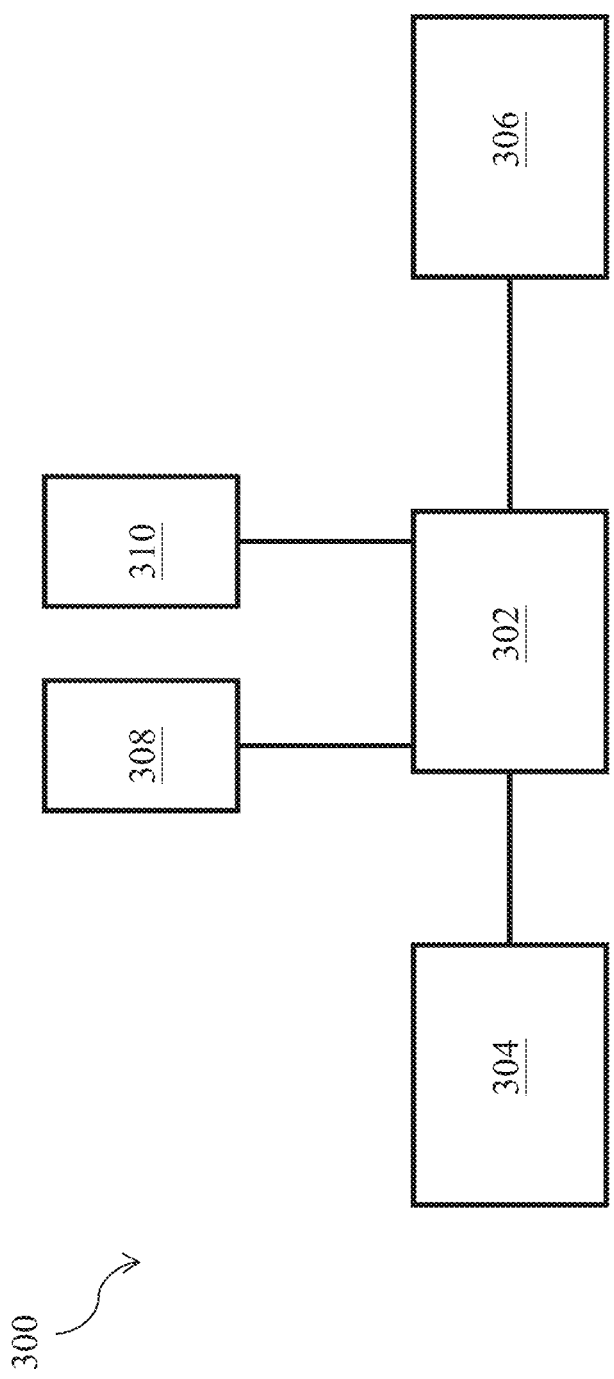
FIG. 9 is a block diagram of an embodiment processing system.

FIG. 9 illustrates a block diagram of an embodiment processing system 300 for performing methods described herein, which may be installed in a host device. The processing system 300 includes a controller 302, a memory 304, and a dual-band VCO 306, which may (or may not) be arranged as shown in FIG. 9. The processing system 300 may include additional components not depicted in FIG. 9, such as interfaces or long-term storage (e.g., non-volatile memory). In some embodiments, the processing system 300 is a radar system, such as an automotive radar system.

The controller 302 is a microcontroller, microprocessor, processor, or the like. The controller 302 executes programming for processing system 300, such as the functioning of an advanced driver assistance system.

The controller 302 is connected to the memory 304. In some embodiments, the memory 304 may be any component or collection of components adapted to store programming and/or instructions for execution of the controller 302. In an embodiment, memory 304 includes a non-transitory computer-readable medium.

The controller 302 is further connected to a dual-band VCO 306. In some embodiments, the dual-band VCO 306 is similar to the dual-band VCO 100 described above with respect to FIGS. 2-4. In some embodiments, the dual-band VCO 306 is similar to the dual-band VCO 200 described above with respect to FIGS. 5-7.

The controller 302 provides a digital signal LR to select the operating mode of the dual-band VCO 306 (e.g., operating in a short-range radar band or a long-range radar band). The dual-band VCO 306 provides a resonant frequency tunable across the two bands as a reference signal to the controller 302. The control voltage $V_C$ is provided by a phase locked loop (PLL) integrated with the controller 302. The digital signal LR may be, e.g., a static control bit for an automotive radar application.

In some embodiments, the controller 302 is further connected to a transmitter 308 and a receiver 310. The transmitter 308 produces a radar signal for measuring distances to nearby objects. The receiver 310 detects reflections of the radar signal from the nearby objects. The controller 302 uses the reference signal from the dual-band VCO 306 to operate the transmitter 308 and the receiver 310.

Figure 10:
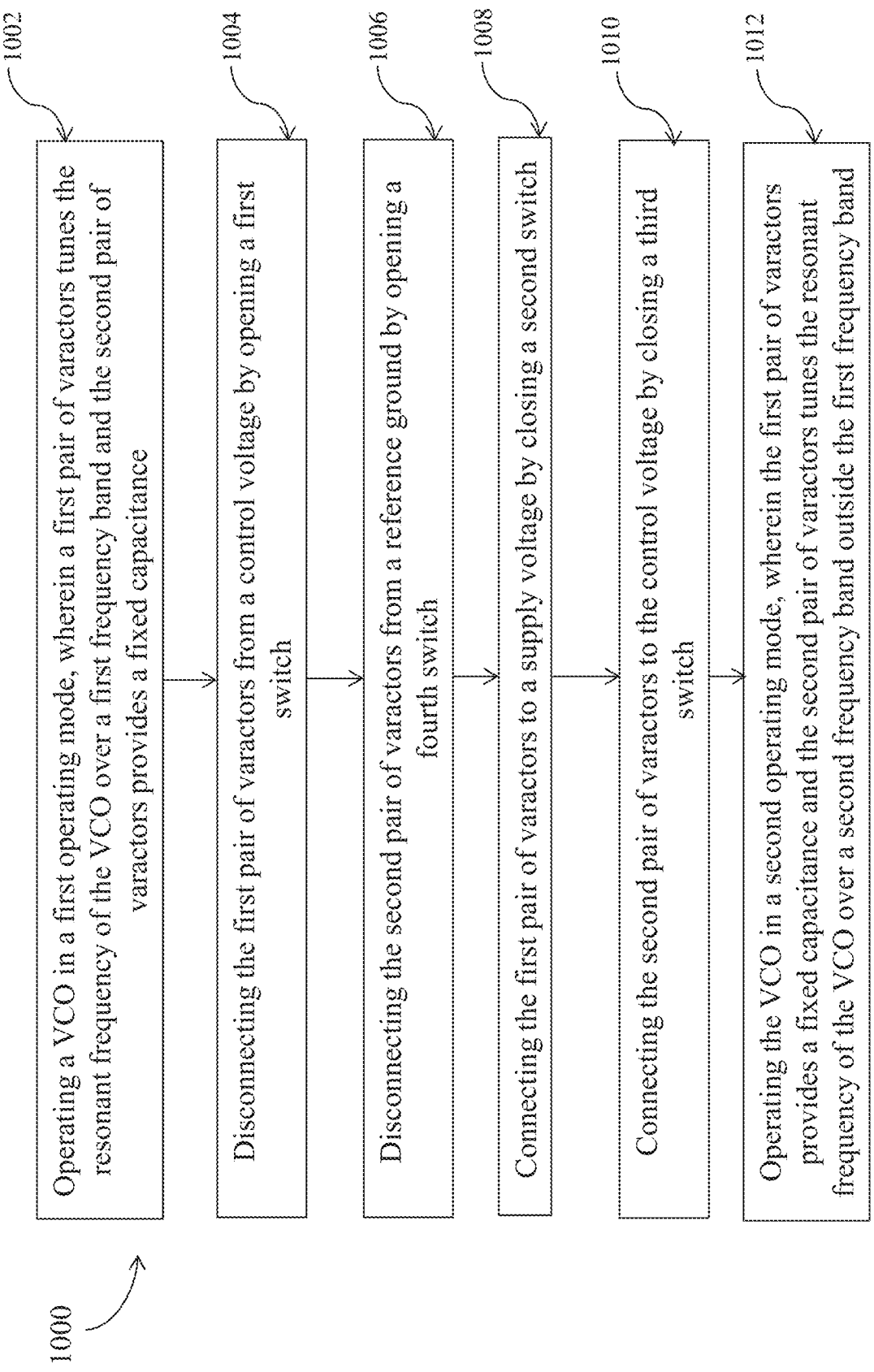
FIG. 10 is a flow chart of an embodiment method for operating a voltage-controlled oscillator.
Figure 11:
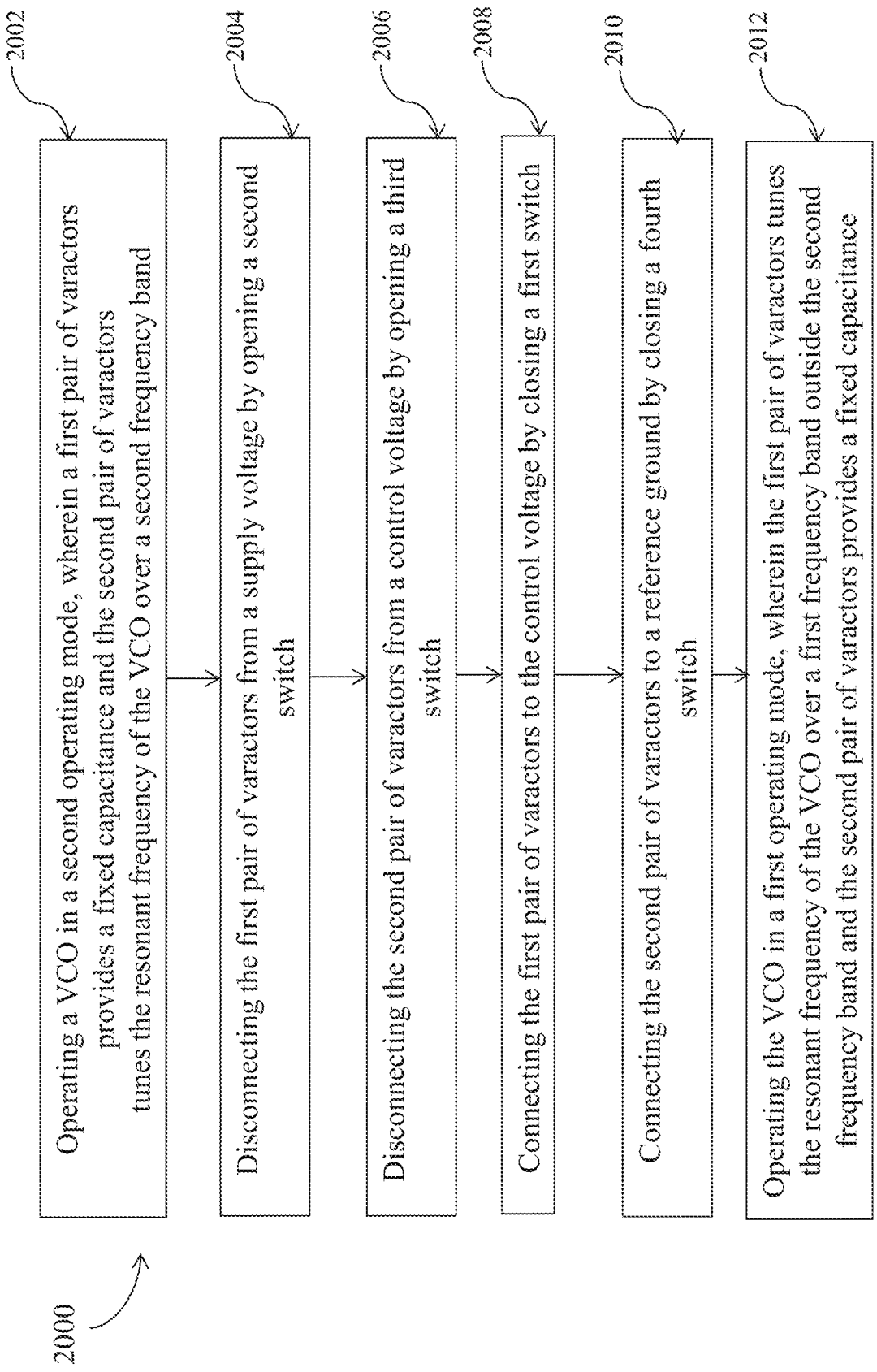
FIG. 11 is a flow chart of an embodiment method for operating a voltage-controlled oscillator.

FIG. 10 illustrates a flow chart of a method 1000 for operating a dual-band voltage-controlled oscillator (VCO) 100, in accordance with some embodiments. Steps 1004, 1006, 1008, and 1010 may be performed in the illustrated order, at the same time, or in any other suitable order.

In step 1002, the dual-band VCO 100 is operated in a first operating mode in which a first pair of varactors $C_{VA}$ tunes a resonant frequency $f_{VCO}$ of the dual-band VCO 100 over a first frequency band and a second pair of varactors $C_{VB}$ provides a fixed capacitance, as described above with respect to FIG. 3.

In step 1004, the first pair of varactors $C_{VA}$ is disconnected from the control voltage $V_C$ by opening the first switch 152, as described above with respect to FIG. 4.

In step 1006, the second pair of varactors $C_{VB}$ is disconnected from the reference ground node by opening the fourth switch 158, as described above with respect to FIG. 4.

In step 1008, the first pair of varactors $C_{VA}$ is connected to the supply voltage $V_{DD}$ terminal by closing the second switch 154, as described above with respect to FIG. 4.

In step 1010, the second pair of varactors $C_{VB}$ is connected to the control voltage $V_C$ by closing the third switch 156, as described above with respect to FIG. 4.

In step 1012, the dual-band VCO 100 is operated in a second operating mode in which the first pair of varactors $C_{VA}$ provides a fixed capacitance and the second pair of varactors $C_{VB}$ tunes the resonant frequency $f_{VCO}$ over a second frequency band outside the first frequency band, as described above with respect to FIG. 4.

Figure ii illustrates a flow chart of a method 2000 for operating a dual-band voltage-controlled oscillator (VCO) 100, in accordance with some embodiments. Steps 2004, 2006, 2008, and 2010 may be performed in the illustrated order, at the same time, or in any other suitable order.

In step 2002, the dual-band VCO 100 is operated in a second operating mode in which a first pair of varactors $C_{VA}$ provides a fixed capacitance and a second pair of varactors $C_{VB}$ tunes a resonant frequency $f_{VCO}$ of the dual-band VCO 100 over a second frequency band, as described above with respect to FIG. 4.

In step 2004, the first pair of varactors $C_{VA}$ is disconnected from a supply voltage by opening the second switch 154, as described above with respect to FIG. 3.

In step 2006, the second pair of varactors $C_{VB}$ is disconnected from the control voltage by opening the third switch 156, as described above with respect to FIG. 3.

In step 2008, the first pair of varactors $C_{VA}$ is connected to the control voltage terminal by closing the first switch 152, as described above with respect to FIG. 3.

In step 2010, the second pair of varactors $C_{VB}$ is connected to the reference ground by closing the fourth switch 158, as described above with respect to FIG. 3.

In step 2012, the dual-band VCO 100 is operated in a first operating mode in which a first pair of varactors $C_{VA}$ tunes a resonant frequency $f_{VCO}$ of the dual-band VCO 100 over a first frequency band outside the second frequency band and a second pair of varactors $C_{VB}$ provides a fixed capacitance, as described above with respect to FIG. 3.

Figure 12:
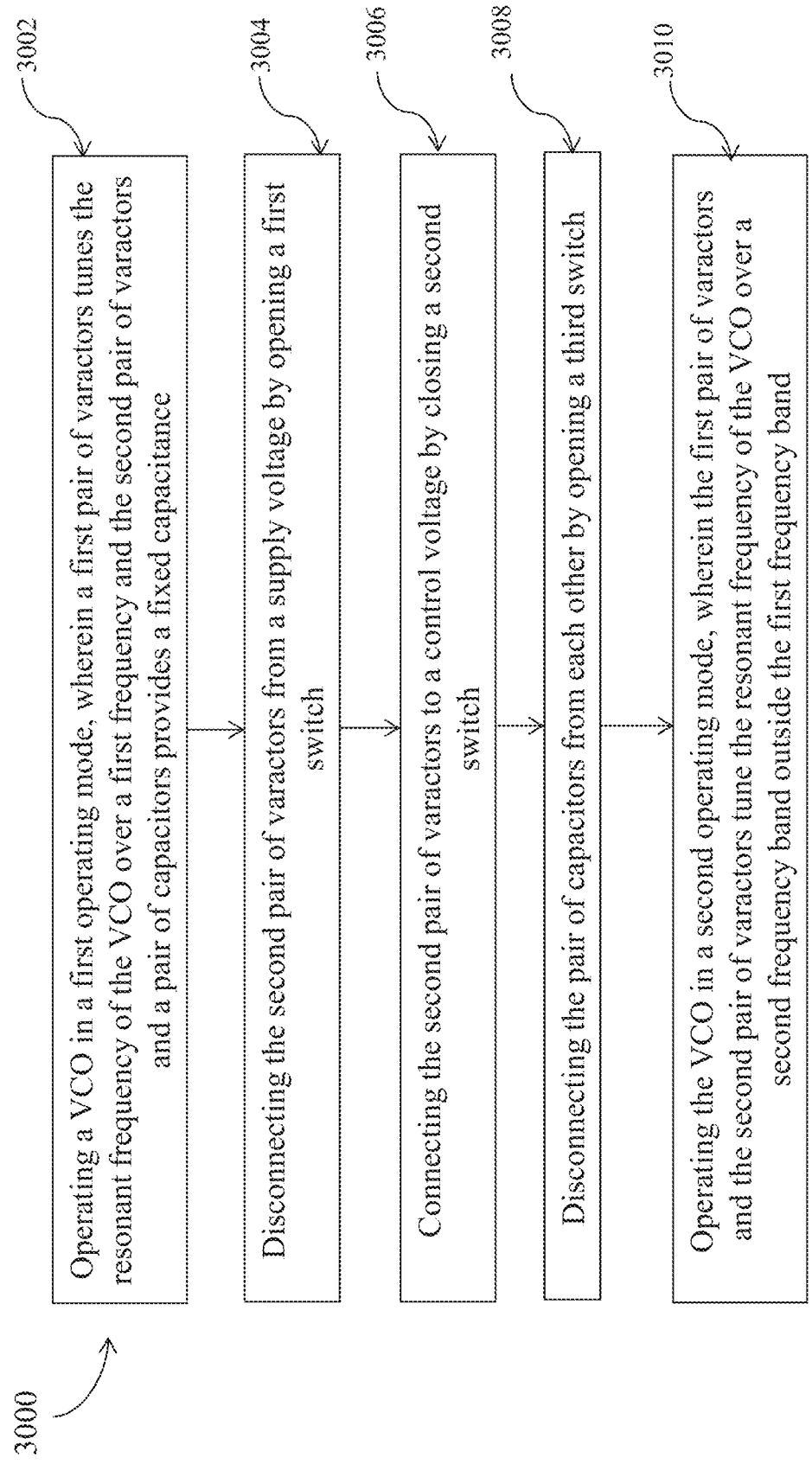
FIG. 12 is a flow chart of an embodiment method for operating a voltage-controlled oscillator.
Figure 13:
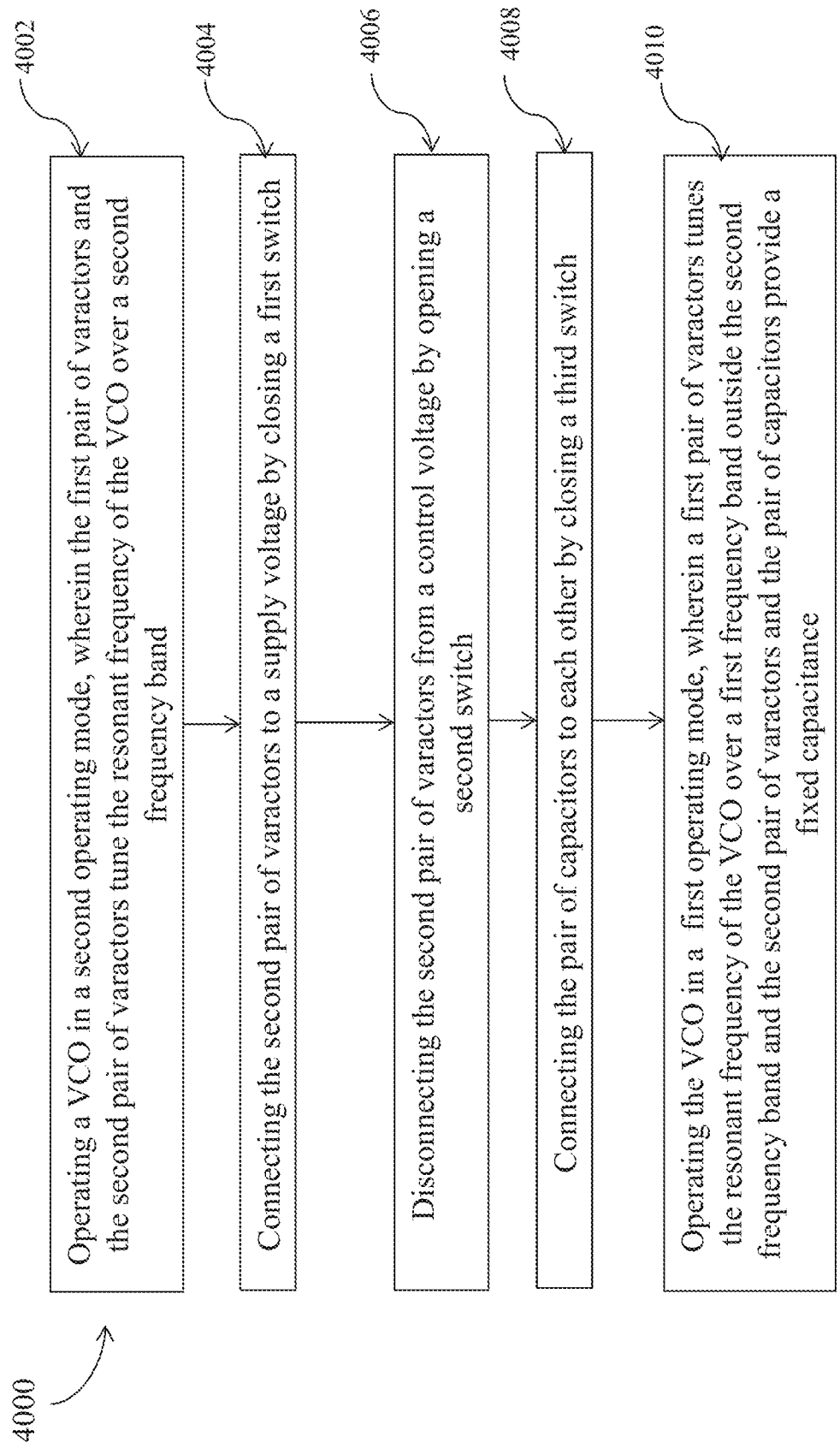
FIG. 13 is a flow chart of an embodiment method for operating a voltage-controlled oscillator.

FIG. 12 illustrates a flow chart of a method 3000 for operating a dual-band voltage-controlled oscillator (VCO) 200, in accordance with some embodiments. Steps 3004, 3006, and 3010 may be performed in the illustrated order, at the same time, or in any other suitable order.

In step 3002, the dual-band VCO 200 is operated in a first operating mode in which a first pair of varactors $C_{VA}$ tunes a resonant frequency $f_{VCO}$ of the dual-band VCO 200 over a first frequency band and a second pair of varactors $C_{VB}$ and a pair of capacitors (first capacitor 242 and second capacitor 244) provide a fixed capacitance, as described above with respect to FIG. 7.

In step 3004, the second pair of varactors $C_{VB}$ is disconnected from the supply voltage $V_{DD}$ terminal by opening the first switch 252, as described above with respect to FIG. 7.

In step 3006, the second pair of varactors $C_{VB}$ is connected to the control voltage $V_C$ by closing the second switch 254, as described above with respect to FIG. 7.

In step 3008, the first capacitor 242 and second capacitor 244 are disconnected from each other by opening the third switch 256, as described above with respect to FIG. 7.

In step 3010, the dual-band VCO 200 is operated in a second operating mode in which the first pair of varactors $C_{VA}$ and the second pair of varactors $C_{VB}$ tune the resonant frequency $f_{VCO}$ of the dual-band VCO 200 over a second frequency band outside the first frequency band, as described above with respect to FIG. 7.

FIG. 14 illustrates a flow chart of a method 4000 for operating a dual-band voltage-controlled oscillator (VCO) 200, in accordance with some embodiments. Steps 4004, 4006, and 4010 may be performed in the illustrated order, at the same time, or in any other suitable order.

In step 4002, the dual-band VCO 200 is operated in a second operating mode in which a first pair of varactors $C_{VA}$ and a second pair of varactors $C_{VB}$ tune the resonant frequency $f_{VCO}$ of the dual-band VCO 200 over a second frequency band, as described above with respect to FIG. 7.

In step 4004, the second pair of varactors $C_{VB}$ is connected to the supply voltage $V_{DD}$ terminal by closing the first switch 252, as described above with respect to FIG. 6.

In step 4006, the second pair of varactors $C_{VB}$ is disconnected from the control voltage $V_C$ by opening the second switch 254, as described above with respect to FIG. 6.

In step 4008, the first capacitor 242 and second capacitor 244 are connected from each other by closing the third switch 256, as described above with respect to FIG. 6.

In step 4010, the dual-band VCO 200 is operated in a first operating mode in which a first pair of varactors $C_{VA}$ tunes a resonant frequency $f_{VCO}$ of the dual-band VCO 200 over a first frequency band outside the second frequency band and a second pair of varactors $C_{VB}$ and a pair of capacitors (capacitor 242 and capacitor 244) provide a fixed capacitance, as described above with respect to FIG. 6.

Example embodiments of the disclosure are summarized here. Other embodiments can also be understood from the entirety of the specification as well as the claims filed herein.

Example 1. A voltage controlled oscillator (VCO) circuit including: a pair of inductors coupled in series; a first pair of varactors coupled in series, a first common mode node being between the respective varactors of the first pair of varactors; a second pair of varactors coupled in series, a second common mode node being between the respective varactors of the second pair of varactors, a first terminal of the first pair of varactors being coupled to a first terminal of the second pair of varactors and a first terminal of the pair of inductors, and a second terminal of the first pair of varactors being coupled to a second terminal of the second pair of varactors and a second terminal of the pair of inductors; a supply voltage node switchably coupled to the first common mode node through a first switch, the supply voltage node being a node located between the pair of inductors; and a control voltage node ($V_C$) switchably coupled to the second common mode node through a second switch.

Example 2. The circuit of example 1, further including an oscillator core coupled to a LC tank circuit including the first and second pairs of varactors and the pair of inductors.

Example 3. The circuit of one of examples 1 or 2, further including a third switch coupling the control voltage node to the first common mode node and a fourth switch coupling a reference ground node to the second common mode node.

Example 4. The circuit of example 1, where the first common mode node is coupled to the second common mode node through the second switch and the control voltage node is coupled to the first common mode node.

Example 5. The circuit of example 4, further including: a first capacitor, a third switch, and a second capacitor coupled in series; a first terminal of the first capacitor being coupled to a first terminal of the first pair of varactors; a second terminal of the first capacitor being coupled to a first terminal of the third switch; a first terminal of the second capacitor being coupled to a second terminal of the third switch; and a second terminal of the second capacitor being coupled to a second terminal of the first pair of varactors.

Example 6. A voltage controlled oscillator (VCO) circuit including: a resonant circuit including a first pair of varactors and a second pair of varactors, a resonant frequency of the resonant circuit depending on a first capacitance of the first pair of varactors and a second capacitance of the second pair of varactors, the resonant frequency setting an output frequency of the VCO circuit; an oscillator core coupled to the resonant circuit; and a switching circuit configured to operate the VCO circuit in a first operating mode and a second operating mode, the switching circuit being configured to select the first pair of varactors for tuning the resonant frequency over a first frequency band in the first operating mode, and the switching circuit being configured to select the second pair of varactors for tuning the resonant frequency over a second frequency band outside the first frequency band in the second operating mode.

Example 7. The VCO circuit of example 6, where the first frequency band is between 38 GHz and 38.5 GHz and the second frequency band is between 38.5 GHz and 40.5 GHz.

Example 8. The VCO circuit of one of examples 6 or 7, where the resonant circuit is a dual supply voltage circuit.

Example 9. The VCO circuit of one of examples 6 to 8, where, in the first operating mode, the switching circuit is configured to set each of the second pair of varactors as a fixed capacitor, and where, in the second operating mode, the switching circuit is configured to set each of the first pair of varactors as a fixed capacitor.

Example 10. The VCO circuit of example 9, where, in the first operating mode, a first switch of the switching circuit couples a first common mode node of the first pair of varactors to a control voltage node.

Example 11. The VCO circuit of one of examples 9 or 10, where, in the first operating mode, a second switch of the switching circuit couples a second common mode node of the second pair of varactors to a ground node.

Example 12. The VCO circuit of one of examples 9 to 11, where, in the second operating mode, a third switch of the switching circuit couples a first common mode node of the first pair of varactors to a supply voltage node.

Example 13. The VCO circuit of one of examples 9 to 12, where, in the second operating mode, a fourth switch of the switching circuit couples a second common mode node of the second pair of varactors to a control voltage node.

Example 14. A method of operating a voltage controlled oscillator (VCO) circuit including: operating the VCO in a first operating mode using a switching circuit, the VCO circuit including a resonant circuit including a first pair of varactors, a second pair of varactors, and a resonant frequency setting an output frequency of the VCO, the switching circuit setting the first pair of varactors to tune the resonant frequency over a first frequency band in the first operating mode; and operating the VCO in a second operating mode using the switching circuit, the switching circuit setting the second pair of varactors to tune the resonant frequency over a second frequency band outside the first frequency band in the second operating mode.

Example 15. The method of example 14, where the switching circuit setting the first pair of varactors to tune the resonant frequency over the first frequency band in the first operating mode includes closing a first switch coupling a first common mode node of the first pair of varactors to a control voltage node.

Example 16. The method of one of examples 14 or 15, where the operating the VCO in the first operating mode further includes biasing the second pair of varactors to act as a fixed capacitor.

Example 17. The method of example 14, where the switching circuit setting the second pair of varactors to tune the resonant frequency over the second frequency band in the second operating mode includes closing a second switch coupling a second common mode of the second pair of varactors to a control voltage node.

Example 18. The method of example 17, where operating the VCO in the second operating mode further includes biasing the first pair of varactors to act as a fixed capacitor.

Example 19. The method of example 14, where operating the VCO in the second operating mode further includes the switching circuit setting the first pair of varactors to tune the resonant frequency over the second frequency band.

Example 20. The method of example 19, where the switching circuit setting the first pair of varactors to tune the resonant frequency over the second frequency band includes closing a first switch coupling a first common mode node of the first pair of varactors with a second common mode node of the second pair of varactors.

Example 21. The method of one of examples 14, 19, or 20, where operating the VCO in the first operating mode further includes the switching circuit coupling a pair of capacitors to each other.

Example 22. A voltage controlled oscillator (VCO) including: a plurality of varactors including a first varactor, a second varactor, a third varactor, and a fourth varactor, a first terminal of the first varactor coupled to a first terminal of the third varactor, a first terminal of the second varactor coupled to a first terminal of the fourth varactor; a switching circuit including a first switch, a second switch, a third switch, and a fourth switch; a control terminal coupled to a first terminal of the first switch and a first terminal of the third switch; a first common mode node coupled to a second terminal of the first varactor, a second terminal of the second varactor, a second terminal of the first switch, and a second terminal of the second switch; and a second common mode node coupled to a second terminal of the third varactor, a second terminal of the fourth varactor, a second terminal of the third switch, and a second terminal of the fourth switch.

Example 23. The VCO of example 22, further including a second control terminal coupled to a control terminal of the first switch, a control terminal of the second switch, a control terminal of the third switch, and a control terminal of the fourth switch.

Example 24. A voltage controlled oscillator (VCO) including: a plurality of varactors including a first varactor, a second varactor, a third varactor, and a fourth varactor, where in a first operating mode, a first terminal of the first varactor and a first terminal of the second varactor are coupled to a control voltage node and a first terminal of the third varactor and a first terminal of the fourth varactor are coupled to a reference ground node, and where in a second operating mode, a first terminal of the first varactor and a first terminal of the second varactor are coupled to a supply voltage node, and a first terminal of the third varactor and a first terminal of the fourth varactor are coupled to the control voltage node; and a plurality of switches including a first switch, a second switch, a third switch, and a fourth switch, where in the first operating mode, the first switch and the fourth switch are in a closed position and the second switch and the third switch are in an open position, and where in the second operating mode, the first switch and the fourth switch are in an open position and the second switch and the third switch are in a closed position.

Example 25. A method, including: operating a voltage controlled oscillator (VCO) in a first operating mode, comprising: coupling, using a first switch of the VCO, a first terminal of a first varactor of the VCO and a first terminal of a second varactor of the VCO to a control voltage node; and coupling, using a fourth switch of the VCO, a first terminal of a third varactor of the VCO and a first terminal of a fourth varactor of the VCO to a reference ground node; and operating the VCO in a second operating mode, comprising: coupling, using a second switch, a first terminal of the first varactor and a first terminal of the second varactor to a supply voltage node; and coupling, using a third switch, a first terminal of the third varactor and a first terminal of the fourth varactor to the control voltage node.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A voltage controlled oscillator (VCO) circuit comprising:
    a pair of inductors coupled in series;
    a first pair of varactors coupled in series, a first common mode node being between the respective varactors of the first pair of varactors;
    a second pair of varactors coupled in series, a second common mode node being between the respective varactors of the second pair of varactors,
        a first terminal of the first pair of varactors being coupled to a first terminal of the second pair of varactors and a first terminal of the pair of inductors, and
        a second terminal of the first pair of varactors being coupled to a second terminal of the second pair of varactors and a second terminal of the pair of inductors; and
    a supply voltage node switchably coupled to the first common mode node through a first switch, the supply voltage node being a node located between the pair of inductors.

2. The circuit of claim 1, further comprising an oscillator core coupled to a LC tank circuit comprising the first and second pairs of varactors and the pair of inductors.

3. The circuit of claim 1, further comprising a control voltage node ($V_C$) switchably coupled to the second common mode node through a second switch, a third switch coupling the control voltage node to the first common mode node, and a fourth switch coupling a reference ground node to the second common mode node.

4. The circuit of claim 1, further comprising a control voltage node ($V_C$) coupled to the second common mode node, and wherein the first common mode node is switchably coupled to the second common mode node through a second switch.

5. The circuit of claim 4, further comprising:
    a first capacitor, a third switch, and a second capacitor coupled in series;
    a first terminal of the first capacitor being coupled to a first terminal of the first pair of varactors;
    a second terminal of the first capacitor being coupled to a first terminal of the third switch;
    a first terminal of the second capacitor being coupled to a second terminal of the third switch; and
    a second terminal of the second capacitor being coupled to a second terminal of the first pair of varactors.

6. A voltage controlled oscillator (VCO) circuit comprising:
    a resonant circuit comprising a first pair of varactors and a second pair of varactors, a resonant frequency of the resonant circuit depending on a first capacitance of the first pair of varactors and a second capacitance of the second pair of varactors, the resonant frequency setting an output frequency of the VCO circuit;
    an oscillator core coupled to the resonant circuit; and
    a switching circuit configured to operate the VCO circuit in a first operating mode and a second operating mode, the switching circuit being configured to select the first pair of varactors for tuning the resonant frequency over a first frequency band in the first operating mode, and the switching circuit being configured to select the second pair of varactors for tuning the resonant frequency over a second frequency band outside the first frequency band in the second operating mode.

7. The VCO circuit of claim 6, wherein the first frequency band is between 38 GHz and 38.5 GHz and the second frequency band is between 38.5 GHz and 40.5 GHz.

8. The VCO circuit of claim 6, wherein, in the first operating mode, the switching circuit is configured to set each of the second pair of varactors as a fixed capacitor, and wherein, in the second operating mode, the switching circuit is configured to set each of the first pair of varactors as a fixed capacitor.

9. The VCO circuit of claim 8, wherein, in the first operating mode, a first switch of the switching circuit couples a first common mode node of the first pair of varactors to a control voltage node.

10. The VCO circuit of claim 8, wherein, in the first operating mode, a second switch of the switching circuit couples a second common mode node of the second pair of varactors to a ground node.

11. The VCO circuit of claim 8, wherein, in the second operating mode, a third switch of the switching circuit couples a first common mode node of the first pair of varactors to a supply voltage node.

12. The VCO circuit of claim 8, wherein, in the second operating mode, a fourth switch of the switching circuit couples a second common mode node of the second pair of varactors to a control voltage node.

13. A method of operating a voltage controlled oscillator (VCO) circuit, the method comprising:
    operating the VCO in a first operating mode using a switching circuit, the VCO circuit comprising a resonant circuit comprising a first pair of varactors, a second pair of varactors, and a resonant frequency setting an output frequency of the VCO, the switching circuit setting the first pair of varactors to tune the resonant frequency over a first frequency band in the first operating mode; and
    operating the VCO in a second operating mode using the switching circuit, the switching circuit setting the second pair of varactors to tune the resonant frequency over a second frequency band outside the first frequency band in the second operating mode.

14. The method of claim 13, wherein the switching circuit setting the first pair of varactors to tune the resonant frequency over the first frequency band in the first operating mode comprises closing a first switch coupling a first common mode node of the first pair of varactors to a control voltage node.

15. The method of claim 13, wherein the operating the VCO in the first operating mode further comprises biasing the second pair of varactors to act as a fixed capacitor.

16. The method of claim 13, wherein the switching circuit setting the second pair of varactors to tune the resonant frequency over the second frequency band in the second operating mode comprises closing a second switch coupling a second common mode of the second pair of varactors to a control voltage node.

17. The method of claim 16, wherein operating the VCO in the second operating mode further comprises biasing the first pair of varactors to act as a fixed capacitor.

18. The method of claim 13, wherein operating the VCO in the second operating mode further comprises the switching circuit setting the first pair of varactors to tune the resonant frequency over the second frequency band.

19. The method of claim 18, wherein the switching circuit setting the first pair of varactors to tune the resonant frequency over the second frequency band comprises closing a first switch coupling a first common mode node of the first pair of varactors with a second common mode node of the second pair of varactors.

20. The method of claim 13, wherein operating the VCO in the first operating mode further comprises the switching circuit coupling a pair of capacitors to each other.

* * * * *